United States Patent
Arp et al.

(10) Patent No.: US 11,275,113 B2
(45) Date of Patent: Mar. 15, 2022

(54) MEASURING A CONTROL SYSTEM RESPONSE TIME

(71) Applicant: INTERNATIONAL BUSINESS MACHINES CORPORATION, Armonk, NY (US)

(72) Inventors: Andreas H. A. Arp, Nufringen (DE); Douglas J. Malone, Pleasant Valley, NY (US); Thomas Makowski, Pfullingen (DE); Michael V. Koch, Ehningen (DE)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 16/776,803

(22) Filed: Jan. 30, 2020

(65) Prior Publication Data

US 2021/0239756 A1    Aug. 5, 2021

(51) Int. Cl.
*G01R 31/317* (2006.01)
*H03K 3/037* (2006.01)
(Continued)

(52) U.S. Cl.
CPC ......... *G01R 31/31725* (2013.01); *G06F 1/10* (2013.01); *H03K 3/037* (2013.01);
(Continued)

(58) Field of Classification Search
CPC .............. H03K 5/00; H03K 5/05; H03K 5/14; H03K 2005/00013; H03K 2005/00019; H03K 2005/00078; H03K 19/003; H03K 19/20; H03K 3/037; G06F 1/04; G06F 1/06; G06F 1/08; G06F 1/10; G06F 1/12; G01R 31/31725; H04L 7/0016; H04L 7/0033; H04L 7/0037
See application file for complete search history.

(56) References Cited

U.S. PATENT DOCUMENTS

| 7,506,193 | B1 | 3/2009 | Shoemaker |
| 7,765,425 | B1 * | 7/2010 | Searles ..................... G06F 1/10 713/503 |

(Continued)

OTHER PUBLICATIONS

Gentry et al., "Accurate, Automatic Adjustment of Virtual Clock Latency in a Hierarchical Integrated Circuit Design", An IP.com Prior Art Database Technical Disclosure, IP.com No. IPCOM000198161D, IP.com Electronic Publication Date: Jul. 27, 2010, 6 pages.

(Continued)

*Primary Examiner* — Diana J. Cheng
(74) *Attorney, Agent, or Firm* — Teddi E. Maranzano

(57) ABSTRACT

Measuring a control system response time of a second clock tree is provided, comprising measuring a skew between the second clock signal and the first clock signal and storing the skew, initiating a delay change of a delay induced by the programmable delay line and starting a time measurement. At least one iteration is performed of measuring the skew between the second clock signal and the first clock signal and comparing the measured skew with the stored skew. Based on the result of the comparison, stopping after a current iteration and stopping the time measurement. A result of the time measurement is the control system response time.

20 Claims, 10 Drawing Sheets

(51) Int. Cl.
   *H03K 19/20* (2006.01)
   *H04L 7/00* (2006.01)
   *G06F 1/10* (2006.01)
   *H03K 5/00* (2006.01)
(52) U.S. Cl.
   CPC ............. *H03K 5/00* (2013.01); *H03K 19/20* (2013.01); *H04L 7/0037* (2013.01); *H03K 2005/00019* (2013.01)

(56) References Cited

U.S. PATENT DOCUMENTS

| | | |
|---|---|---|
| 7,904,265 B2 | 3/2011 | Tesler |
| 8,294,498 B2 | 10/2012 | Wang |
| 8,610,475 B2 | 12/2013 | Kim |
| 9,191,193 B1 | 11/2015 | Huang |
| 9,432,025 B1 | 8/2016 | Khor |
| 9,571,308 B1 | 2/2017 | Lugthart |
| 9,660,653 B1 | 5/2017 | Khor |
| 10,063,222 B1 | 8/2018 | Arp |
| 10,148,259 B1 | 12/2018 | Arp |
| 11,043,946 B1 | 6/2021 | Arp |
| 2008/0204103 A1 | 8/2008 | Jung |
| 2016/0134267 A1 | 5/2016 | Adachi |
| 2018/0069540 A1 | 3/2018 | Arp |
| 2018/0222231 A1 | 8/2018 | Liu |
| 2018/0331676 A1 | 11/2018 | Arp |
| 2019/0064872 A1 | 2/2019 | Bourgeault |
| 2019/0081619 A1 | 3/2019 | Kim |
| 2019/0103861 A1 | 4/2019 | Arp |
| 2021/0239755 A1 | 8/2021 | Arp |
| 2021/0242860 A1 | 8/2021 | Arp |

OTHER PUBLICATIONS

Gentry et al., "Method and Apparatus for Automatic Adjustment of Clock Uncertainty in an Integrated Circuit Design", An IP.com Prior Art Database Technical Disclosure, IP.com No. IPCOM000198162D, IP.com Electronic Publication Date: Jul. 27, 2010, 5 pages.

IBM: List of IBM Patents or Patent Applications Treated as Related (Appendix P), Jan. 31, 2020, pp. 1-2.

Pending U.S. Appl. No. 16/776,790, filed Jan. 30, 2020, entitled: "Quantitative Skew Sensor", 37 pages.

Pending U.S. Appl. No. 16/776,776, filed Jan. 30, 2020, entitled: "Continuous Skew Adjust", 43 pages.

Pending U.S. Appl. No. 16/776,764, filed Jan. 30, 2020, entitled: "Cycle Accurate Skew Adjust", 46 pages.

* cited by examiner

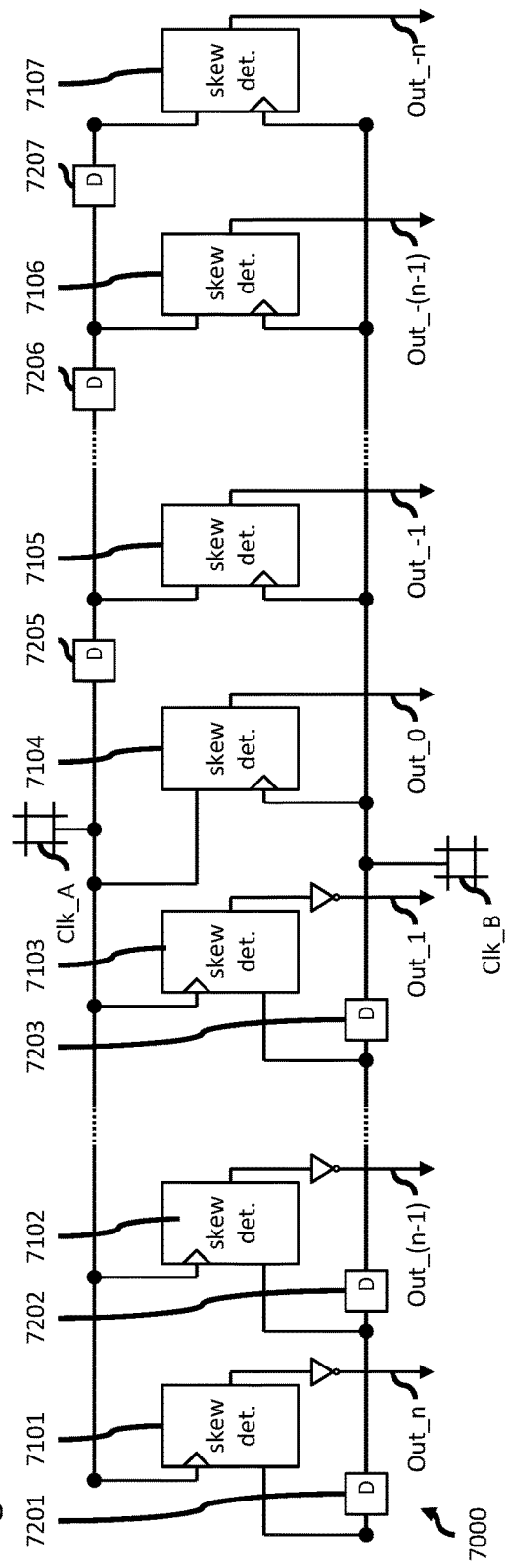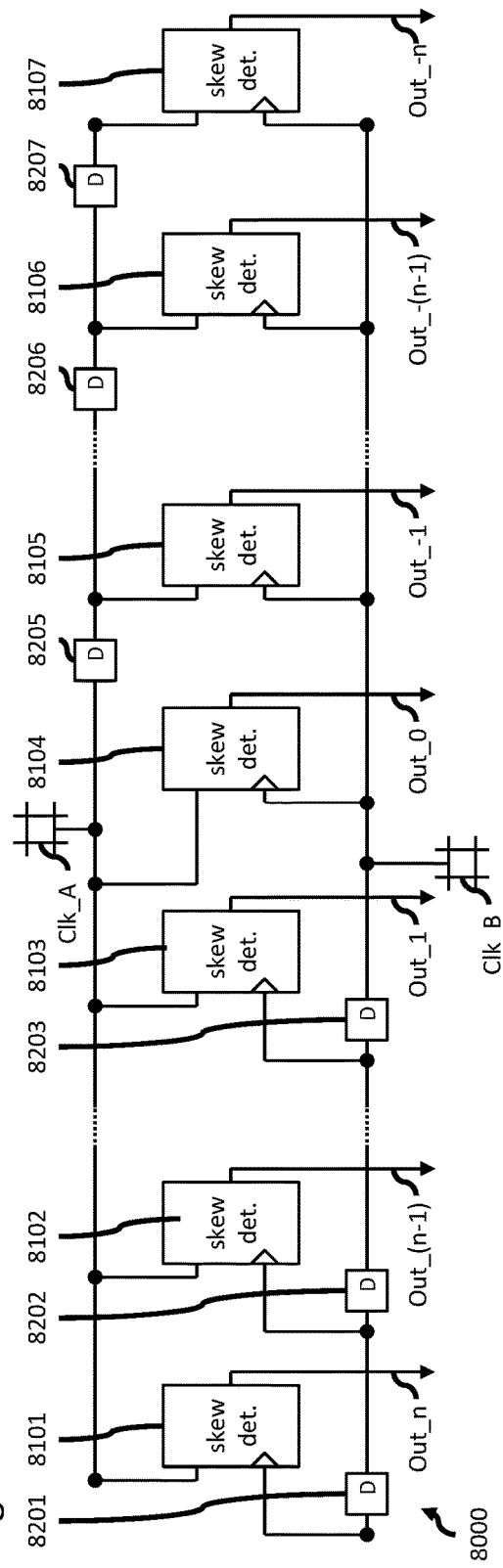

MEASURING A CONTROL SYSTEM RESPONSE TIME

BACKGROUND

The present invention relates generally to computer systems and, more particularly, relates to a logic device comprising a clock source and several clock domains. In particular, the disclosure relates to adjusting the skew between two clock signals.

SUMMARY

Aspects of the present invention relate to a method for measuring a control system response time of a second clock tree, wherein the second clock signal has been propagated from a first clock source through a second clock tree, wherein the second clock tree comprises a programmable delay line induces a delay, wherein the first clock signal has been propagated from the first clock source through a first clock tree, wherein the method comprises measuring a skew between the second clock signal and the first clock signal and storing the skew, initiating a delay change of a delay induced by the programmable delay line and starting a time measurement, at least one iteration of measuring the skew between the second clock signal and the first clock signal; comparing the measured skew with the stored skew; based on the result of the comparison, stopping after a current iteration and stopping the time measurement, and wherein a result of the time measurement is the control system response time.

Other aspects of the present invention relate to a logic device for measuring a control system response time of a second clock tree, wherein the second clock signal has been propagated from a first clock source through a second clock tree, wherein the second clock tree comprises a programmable delay line that induces a delay, wherein the first clock signal has been propagated from the first clock source through a first clock tree, wherein the logic device comprises a counter that is clocked by one of the first clock signal and the second clock signal, wherein the skew control unit measures a control system response time of the second clock tree and determining the second clock tree latency based on the control system response time, wherein measuring the control system response time of the second clock tree comprises measuring a skew between the second clock signal and the first clock signal and storing the skew, initiating a delay change of a delay induced by the programmable delay line and starting a time measurement, at least one iteration of measuring the skew between the second clock signal and the first clock signal; comparing the measured skew with the stored skew; based on the result of the comparison, stopping after a current iteration and stopping the time measurement, and wherein a result of the time measurement is the control system response time, wherein starting a time measurement comprises initializing and starting a counter, and wherein stopping a time measurement comprises stopping the counter.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 7 shows a third skew sensor;

FIG. 8 shows a fourth skew sensor;

DETAILED DESCRIPTION

Aspects of the present invention relate to a logic device comprising a clock source and several clock domains. Moreover, the disclosure relates to a method for synchronizing clock domains of a logic device. A logic device may comprise a first semiconductor circuit and a second semiconductor circuit each having an associated clock domain. The clock domains of the first semiconductor circuit and the second semiconductor circuit exchanging data have to be in synchronization to avoid data loss and/or data faults.

The first semiconductor circuit and the second semiconductor circuit may be driven by a common clock source. However, the clock signal of one clock domain of one semiconductor circuit may be late or early with respect to the clock signal of the clock domain of the other semiconductor circuit. The difference may also be called "skew". Programmable delay lines may be provided between the clock source and the clock domains. The programmable delay lines may be adjusted to change the skew between the first clock domain and the second clock domain. In particular, the skew may be minimized to ensure proper data exchange between the first semiconductor circuit and the second semiconductor circuit. There may be further application requiring two periodic digital signals having a well-defined skew. Hence, the terms "clock signal" used hereinafter may relate to any periodic digital.

Figure 1:
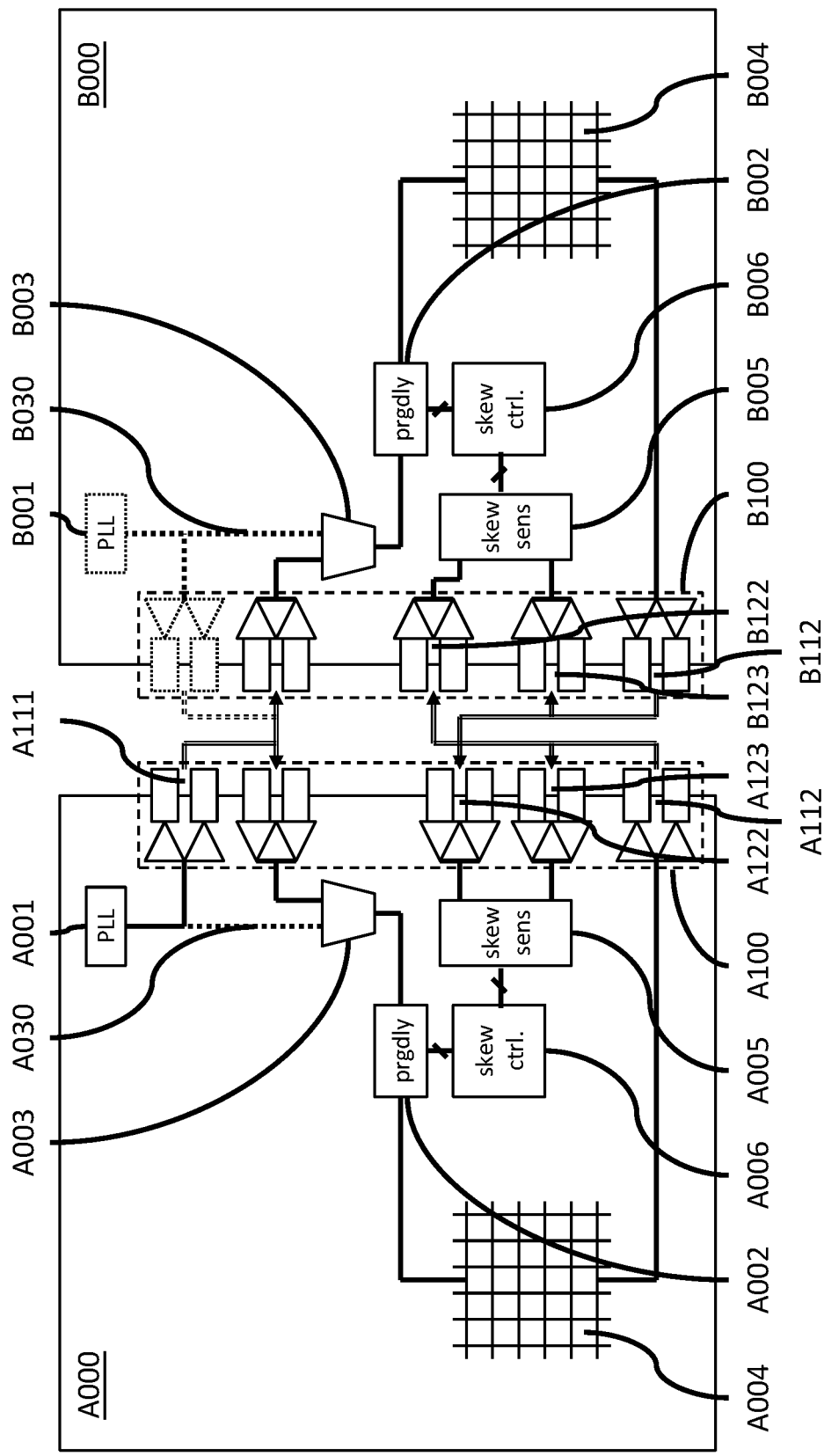
FIG. 1 shows a logic device comprising a first semiconductor circuit and a second semiconductor circuit.

FIG. 1 shows a logic device comprising a first semiconductor circuit A000 and a second semiconductor circuit B000.

The first semiconductor circuit A000 and the second semiconductor circuit B000 may correspond to computer processor chips, wherein each computer ship may comprise several processor cores and several caches to allow for exchanging data between the different processor cores of the respective computer processor chip.

The first semiconductor circuit A000 may be adapted for directly writing data into latches of the second semiconductor circuit B000 and vice versa. Heretofore, it may be required that the first semiconductor circuit A000 and the second semiconductor B000 operate at the same frequency and with minimal skew to avoid data losses.

The first semiconductor circuit A000 comprises a first clock source A001 and a first programmable delay line A002. The clock source A001 may transmit a first clock signal clk_A which propagates through a multiplexer A003 and the first programmable delay line A002 via first clock distribution network tree A004, which may also be called first clock tree, to the first clock domain. The first semiconductor circuit A000 may further comprise a first skew sensor A005 and first skew controller A006. The first skew controller A006 may be configured to adjust a delay induced by the programmable delay line A002 based on an output of the first skew sensor A005.

The second semiconductor circuit B000 may be configured similar to the first semiconductor circuit A000 and comprise a second clock source B001, a second programmable delay line B002, a multiplexer B003, a second clock distribution network B004, which may also be called second clock tree, a second skew sensor B005 and a second skew controller B006.

During operation of the logic device only one of the two clock source A001 and B001 is used. The first semiconductor circuit A000 and the second semiconductor circuit B000 may be operated independently from each other. In this case, each semiconductor circuit A000 and B000 may use its own clock source A001 and B001, respectively. Direct connections A030 and B030 from the clock sources A001 and B001 to the respective multiplexer A003 and B003 may be used in these circumstances. Alternatively, the first semiconductor circuit A000 and the second semiconductor circuit B000 may be operated together. Heretofore, both semiconductor circuits A000 and B000 may synchronously exchange data and only one of the two clock sources A001 and B001 may be used.

For explanation purposes, it may be assumed that the clock source A001 is used.

The power supply voltages of the first semiconductor circuit A000 and the second semiconductor circuit B000 may be independent from one another. A first group A100 of differential drivers and differential receivers A100 and a second group B100 of differential drivers and differential receivers may be used for exchanging signals with the other semiconductor circuit. In particular, voltage levels different from the power supply voltage levels of the first semiconductor circuit A000 and the second semiconductor circuit B000 may be used for the transmission of the signals between the first semiconductor circuit A000 and the second semiconductor circuit B000.

Typically, the first clock source A001 transmits the clock signal via a differential driver to a differential receiver of the first semiconductor circuit A000 and to a differential receiver of the second semiconductor circuit B000. Hence, any delay induced by the differential driver A111 affects the first semiconductor circuit A000 and the second semiconductor circuit B000 in essentially the same way.

The clock signal is than propagated through the multiplexers A003 and B003, the programmable delay lines A002 and B002, the clock distribution networks A004 and B004 to the differential drivers A112 and B112, respectively. The skew sensor B005 receives the clock signal as first clock signal clk_A from the differential driver A112 via the differential receiver B122 and the clock signal as second clock signal clk_B from the differential driver B112 via the differential receiver B123. Correspondingly, the skew sensor A005 receives the clock signals from the differential driver B112 via the differential receiver A122 and from the differential driver A112 via the differential receiver A123.

Figure 2:
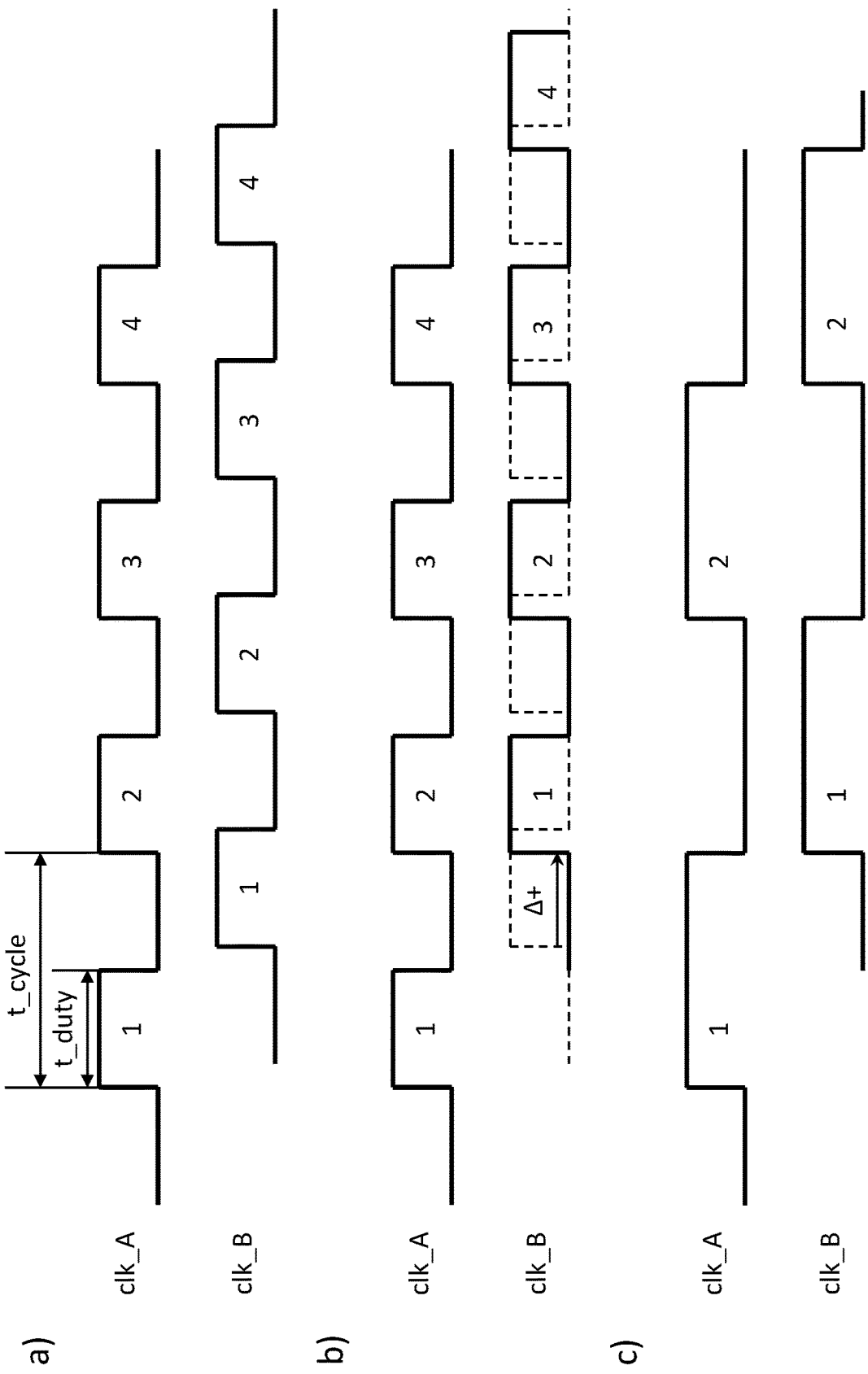
FIG. 2 shows the signal behavior of a first method of deskewing a second clock signal with respect to a first clock signal.
Figure 3:
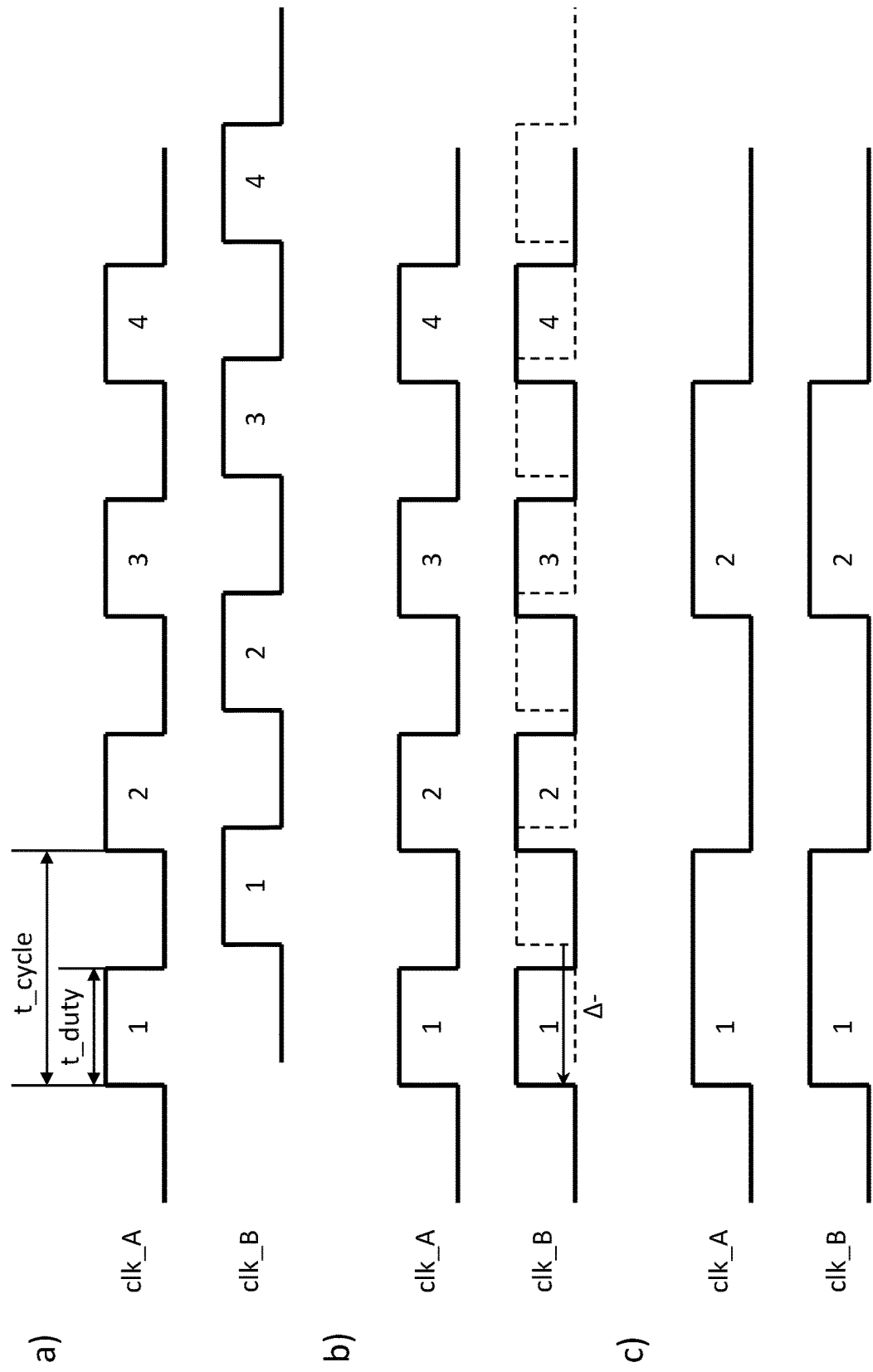
FIG. 3 shows the signal behavior of a second method of deskewing a second clock signal with respect to a first clock signal.

FIGS. 2 and 3 focus on the situation at the skew sensor B005. However, corresponding explanations apply to the skew sensor A005. In particular, FIGS. 2 and 3 show a first clock signal clk_A and a second clock signal clk_B.

The first clock signal clk_A and the second clock signal clk_B both have the same cycle time t_cycle. For example, the cycle time of the first clock signal clk_A and the second clock signal clk_B may be 200 ps. As shown in FIGS. 2 and 3, a duty cycle time t_duty of the first clock signal clk_A and the second clock signal clk_B may amount to half of the cycle time t_cycle (|tree_off|>t_cycle/2).

As explained above, the propagation of clock signals from the clock source through a clock distribution network tree requires a certain amount of time which may be called clock tree latency. As shown in situation a) in FIGS. 2 and 3, the first clock tree latency tree_A of the first semiconductor circuit A000 may differ from the second clock tree latency tree_B of the second semiconductor circuit B000. In particular, a clock tree latency offset tree_off, i.e. the difference between the second clock tree latency tree_B and the first clock tree latency tree_A may be larger than half of the cycle time (t_cycle/2).

In the example shown in FIGS. 2 and 3, the second clock tree latency tree_B is greater than the first clock tree latency tree_A. For example, the second clock tree latency tree_B may amount to 1160 ps and the first clock tree latency tree_A may amount to 1000 ps.

Typically, the skew between two clocks, e.g. the clk_A and the clk_B, is minimized by aligning edges of the same type, i.e. either the rising edge of clk_A and the rising edge of clk_B or the falling edge of clk_A and the falling edge of clk_B Minimizing the skew between two clocks may also be called deskewing. A clock tree latency (here: tree_B) of the clock (here: clk_B) to be deskewed with respect to the other clock (here: clk_A) is increased or decreased by the minimum amount required to align two edges of the same type. Alternatively, the clock tree latency (here: tree_B) of the clock (here: clk_B) to be deskewed with respect to the other clock (here: clk_A) is increased by the minimum amount required to align two edges of the same type if the clock (here: clk_B) to be deskewed with respect to the other clock (here: clk_A) is early with respect to the other clock (here: clk_A) and the other clock tree latency (here: tree_A) is increased by the minimum amount required to align to edges of the same type if the clock (here: clk_B) to be deskewed is late with respect to the other clock (here: clk_A). Using the minimum amount required may have the advantage that less time may be required to deskew the two clocks.

For example, deskewing may be performed by increasing or decreasing the second clock tree latency tree_B. As shown in situation a) of FIG. 2, the rising edge of cycle 1 of the second clock clk_B is closest to the rising edges of cycle 2 of the first clock signal clk_A. Hence, the second clock tree latency tree_B is increased by an amount Δ+ such that the edges of the clock signals clk_A and clk_B are aligned.

The frequency, at which the first semiconductor circuit A000 and the second semiconductor circuit B000 operate, may change during operating of the logic device to optimize computing power and power consumption. A reduced frequency corresponds to a longer cycle time t_cycle. In situation c) of FIG. 2, the cycle time t_cycle of the clock signals clk_A and clk_B is twice as long as in situations a) and b). The clock signals clk_A and clk_B are no longer deskewed. The skew between the clock signals clk_A and clk_B is even larger than in the original situation a). Thus, the clock signals clk_A and clk_B have to be deskewed again.

FIG. 3 illustrates in situation b) that by decreasing the second clock tree latency tree_B by an amount Δ-the rising edges of the clock signals clk_A and clk_B of the same cycle can be aligned and that in this situation the two clock signals remain essentially deskewed when the first semiconductor circuit A000 and the second semiconductor circuit B000 operate at a lower frequency. Nevertheless, a small skew (not shown) may be present due to a different frequency dependency of the first clock tree latency tree_A and the second clock tree latency tree_B.

Figure 4:
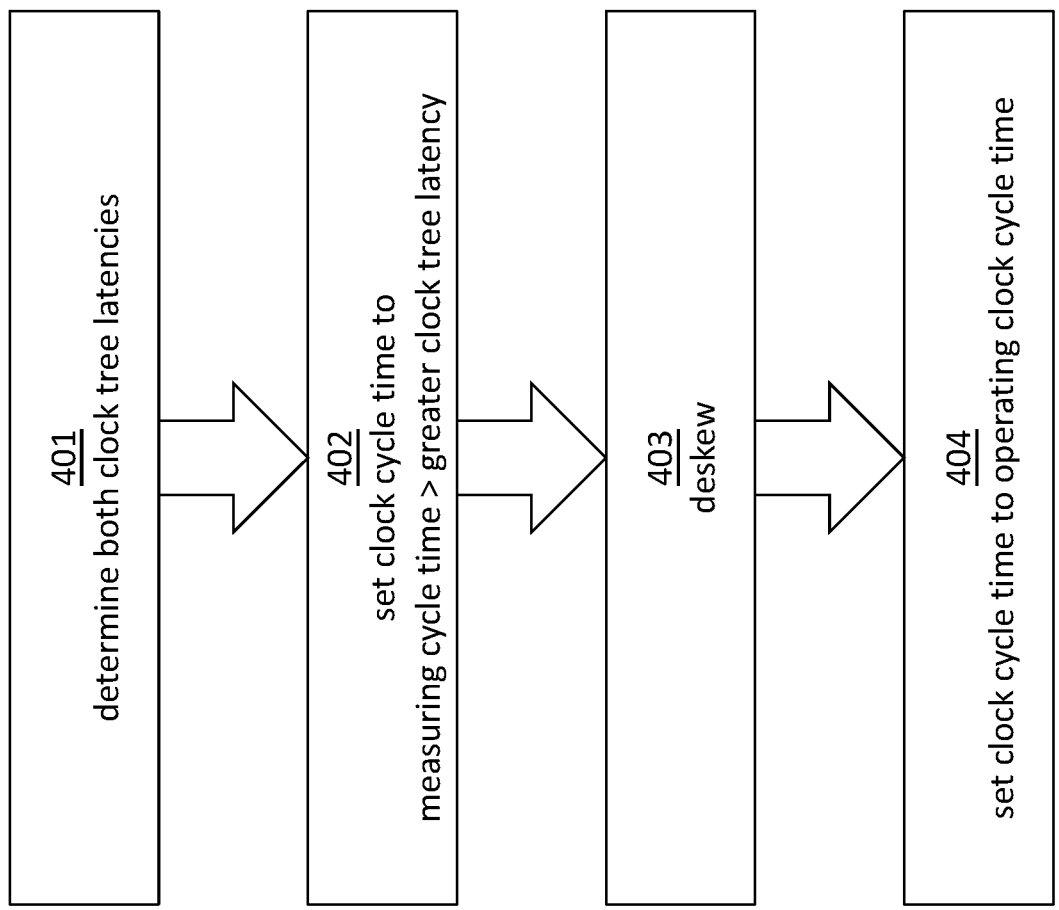
FIG. 4 is a flowchart illustrating a method for deskewing a second clock signal with respect to a first clock signal.

FIG. 4 is a flow chart illustrating an exemplary method for deskewing a second clock signal clk_B with respect to a first clock signal clk_A.

Step 401 determines the first clock tree latency tree_A and the second clock tree latency tree_B. The first clock tree latency tree_A may be determined using the result of a simulation of the first semiconductor circuit A000. Likewise, the second clock tree latency tree_B may be determined using the result of a simulation of the second semiconductor circuit B000. Alternatively, the first clock tree latency tree_A and/or the second clock tree latency tree_B may be determined using a measuring method. Afterwards, in step 402, the cycle time t_cycle is set to a measuring cycle time longer than the longer one of the first clock tree latency tree_A and the second clock tree latency tree_B. Once the cycle time has been set to the measuring cycle time, deskewing is performed (step 403). As the clock cycle time is longer than the first clock tree latency tree_A and the second clock tree latency tree_B, it is no longer possible to align two corresponding edges of different cycles. The method allows for deskewing the first clock signal clk_A and the second clock signal clk_B in such a way that the deskewed state may be essentially maintained for changing cycle times. After deskewing has been performed, the cycle time may be set back to the operating cycle time (step 404).

In the embodiment shown in FIG. 1, the first clock source A001 may be a phase locked loop (PLL) clock swinging in phase with an external clock signal (not shown). Typically, the first clock source A001 emits a first clock signal clk_A having a frequency which is a rational multiple greater than one of the frequency of the external clock signal. In particular, a divider setting may be provided dividing the cycle time of the external clock signal to obtain a cycle time t_cycle for operating the first semiconductor circuit A000.

Setting the cycle time to a measuring cycle time t_meas as described hereinbefore may comprise bypassing the first clock source A001 and directly operating the first semiconductor circuit A000 with the external clock signal. This may reduce the need for additional components for changing the cycle time t_cycle.

Alternatively, setting the cycle time to a measuring cycle time t_meas as described hereinbefore may include changing the divider setting of the first clock source A001. This may allow for setting the measuring cycle time t_meas closer to the longer on of the first clock tree latency tree_A and the second clock tree latency tree_B. Accordingly, the measuring cycle time t_meas will be closer to the operating cycle time t_cycle and less skew changes may be induced by changing the cycle time from the measuring cycle time t_meas to the operating cycle time t_cycle. Moreover, no additional components may be required.

In a still further example, a clock divider may be provided after the first clock source A001. The clock divider may be programmable and allow for setting the measuring cycle time t_meas very close to the longer one of the first clock tree latency tree_A and the second clock tree latency tree_B.

Different skew sensors may be used for deskewing the second clock signal clk_B with respect to the first clock signal clk_A. A very simple skew sensor may only detect whether the second clock signal clk_B is late with respect to the first clock signal clk_A. A skew sensor which only detects whether a second clock signal clk_B is late with respect to a first clock signal clk_A may also be called skew detector. Such a skew detector may be very easy to implement and may have a very small footprint.

In case the skew detector detects that the second clock signal clk_B is late/early, the delay induced by the second programmable delay line may be sequentially decremented/incremented until the skew detector detects that the second clock signal clk_B is no longer late/early, i.e. the second clock signal clk_B is early/late with respect to the first clock signal clk_A. If the skew detector alternatingly detects that the second clock signal clk_B is late and that the second clock signal clk_B is not late, the first clock signal clk_A and the second clock signal clk_B may be considered deskewed.

In case of a large original skew between the first clock signal clk_A and the second clock signal clk_B, it may take a long time until sequentially decrementing/incrementing the delay induced by the second programmable delay line leads to a deskewed state.

Figure 6:
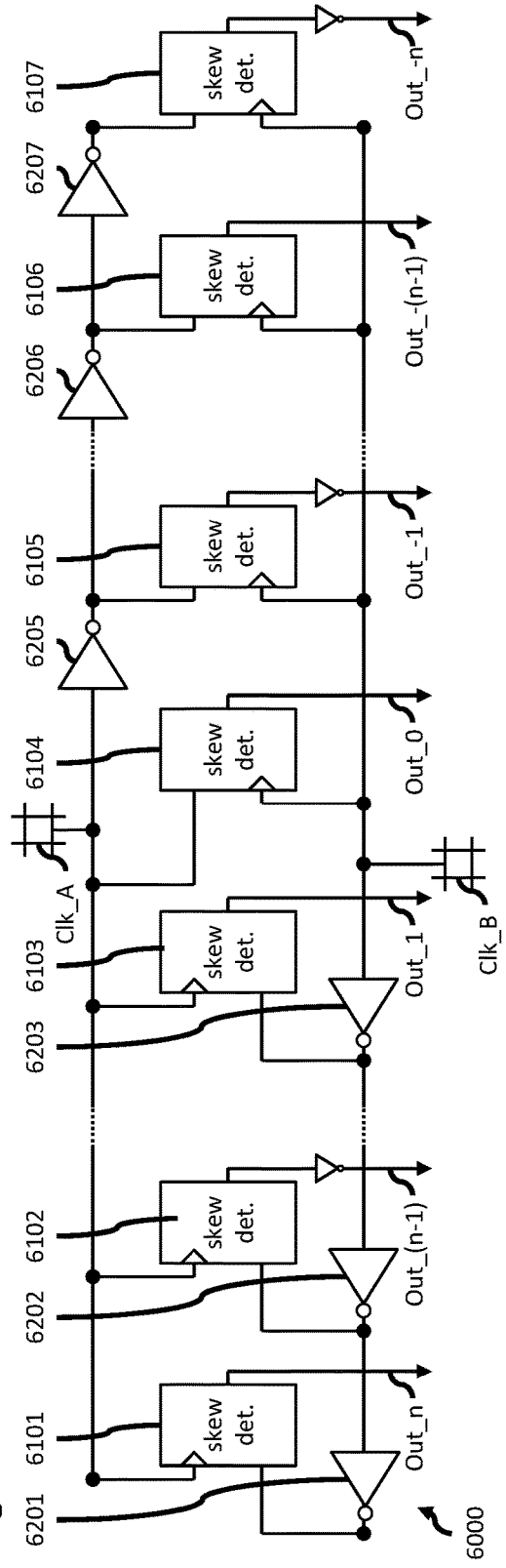
FIG. 6 shows a second skew sensor.

FIGS. 6 to 8 show further skew sensors 5000, 6000, 7000, 8000 which may be used for deskewing the first clock signal clk_A and the second clock signal clk_B. The skew sensors 5000, 6000, 7000, 8000 shown in FIGS. 6 to 8 are not only adapted for detecting a skew between the second clock signal clk_B and first clock signal clk_A but also for measuring the quantitative skew between the second clock signal clk_A and the first clock signal clk_B.

Each of the skew sensors 5000, 6000, 7000, 8000 comprises at least two skew detectors 5101 to 5107, 6101 to 6107, 7101 to 7107, and 8101 to 8107, respectively. The skew detectors 5101 to 5107, 6101 to 6107, 7101 to 7107, and 8101 to 8107 detect a skew between two input signals. Each skew sensor 5000, 6000, 7000, 8000 comprises one or more delay elements 5201 to 5203, 5205 to 5207; 6201 to 6203, 6205 to 6207; 7201 to 7203, 7205 to 7207; 8201 to 8203, 8205 to 8207. At least one skew detector 5101 to 5103, 5105 to 5107; 6101 to 6103, 6105 to 6107; 7101 to 7103, 7105 to 7107; 8101 to 8103, 8105 to 8107 receive either the first clock signal clk_A or the second clock signal clk_B as first input signal and the other one of the first clock signal clk_A and the second clock signal clk_B delayed by a first delay difference induced by one or more delay elements as second input signal and another skew detector 5101 to 5107; 6101 to 6107; 7101 to 7107; 8101 to 8107 receive either the first clock signal clk_A or the second clock signal clk_B as first input signal and the other one of the first clock signal clk_A and the second clock signal clk_B optionally delayed by a second delay difference induced by one or more delay elements, wherein the second delay difference is different from the first delay difference, as second input signal.

The proposed skew sensors 5000, 6000, 7000, 8000 permit determining if the skew between the first clock signal clk_A and the second clock signal clk_B is within a certain range.

The skew sensors 5000, 6000, 7000, 8000 use skew detectors 5101 to 5107, 6101 to 6107, 7101 to 7107 and 8101 to 8107 which detect whether the input signal at the input indicated with a small triangle is late with respect to the other input signal. If this is the case, the skew detectors 5101 to 5107, 6101 to 6107, 7101 to 7107 and 8101 to 8107 will transmit a "1". Otherwise, the skew detectors 5101 to 5107, 6101 to 6107, 7101 to 7107 and 8101 to 8107 will transmit a "0".

The skew detectors 5101 to 5107, 6101 to 6107, 7101 to 7107 and 8101 to 8107 may correspond to D flip-flops and the input of the skew detectors 5101 to 5107, 6101 to 6107, 7101 to 7107 and 8101 to 8107 indicated with the small triangle may be called clock input and the other input of the skew detectors 5101 to 5107, 6101 to 6107, 7101 to 7107 and 8101 to 8107 may be called data input. Thus, these names will be used for the inputs of the skew detectors 5101 to 5107, 6101 to 6107, 7101 to 7107 and 8101 to 8107 in the following description even if the skew detectors 5101 to 5107, 6101 to 6107, 7101 to 7107 and 8101 to 8107 do not necessarily correspond to D flip-flops.

The skew sensor 5000 comprises a first subset of delay elements 5201 to 5203 and a second subset of delay elements 5205 to 5207. Each delay element 5201 to 5203 of the first subset is provided between the second clock signal clk_B and the clock input of the corresponding skew detector 5101 to 5103. For example, the delay element 5201 is arranged between the second clock signal clk_B and the skew detector 5101. Each delay element 5205 to 5207 of the second subset is provided between the first clock signal clk_A and the data input of the corresponding skew detector 5105 to 5107.

The induced delay may increase from the delay element 5203 to the delay element 5201 and from the delay element 5205 to the delay element 5207. In particular, the delay may increase by delay increments D. The delay elements 5201 to 5203, 5205 to 5207 may comprise an even number of inverters.

Figure 5:
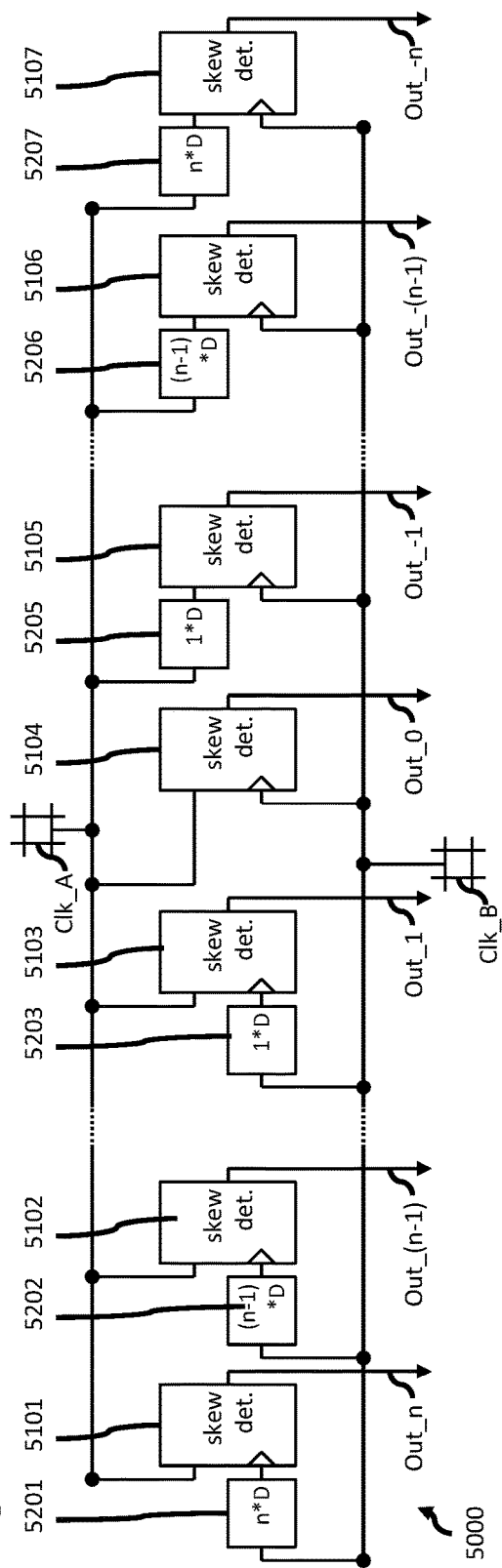
FIG. 5 shows a first skew sensor.

In the example shown in FIG. 5, the delay induced by the delay elements 5203 to 5201 and 5205 and 5207 increases from the central skew detector 5104 to the next skew detector always by the same increment D. However, it is also possible to select the delay steps differently. For example, the delay steps near the central skew detector 5104 may smaller than the delay steps further away from the central skew detector 5104. Vice versa, the delay steps near the central skew detector 5104 may be larger than the delay steps further away from the central skew detector 5104.

Seven skew detectors 5101 to 5107 are shown in FIG. 5. However, the skew sensor 5000 may also comprise fewer or more skew detectors 5101 to 5107 to allow for measuring a skew in finer or coarser steps. The same applies to the skew sensors 6000, 7000 and 8000.

FIG. 8 shows a skew sensor 8000 very similar to the skew sensor 5000. Instead of separate delay elements 5201 to 5203 and 5205 to 5207, each connected directly to the second clock signal clk_B and the first clock signal clk_A, the subsets of delay elements 8201 to 8203 and 8205 to 8207 are provided as chains. The delay element 8203 is directly connected to the second clock signal clk_B, the delay element 8202 connected to the delay element 8203, etc. Correspondingly, the delay element 8205 is directly connected to first clock signal clk_A, the delay element 8206 to the delay element 8205, etc. The clock inputs of the skew detectors 8101 to 8104 and the data inputs of the skew detectors 8105 to 8107 are connected to the nodes of the chains of delay elements 8201 to 8203 and 8205 to 8207, respectively.

Hence, each delay element 8201 to 8203, 8205 to 8207 defines the additional delay between two neighboring skew detectors 8105 to 8107. Using chains of delay elements 8201 to 8203 and 8205 to 8207 may reduce total area required for the delay elements on the respective semiconductor circuit.

The skew sensor 6000 shown in FIG. 6 comprises two subsets of delay elements 6201 to 6203 and 6205 to 6207 provided as chains like the skew sensor 8000. The delay elements 6201 to 6203, 6205 to 6207 may comprise one inverter or an odd number of inverters. A single inverter may induce a particularly short delay. Using inverters as delay elements 6201 to 6203, 6205 to 6207 may require connecting the not delayed first clock signal clk_A and the not delayed second clock signal clk_B to the clock inputs of the skew detectors 6101 to 6103 and 6104 to 6107, respectively.

Inverters may be required at the outputs of the skew detectors 6102, 6105, 6107 to have the skew sensor 6000 transmitting the same output signals as the skew sensors 5000 and 8000 for a second clock signal clk_B having the same skew with respect to a first clock signal clk_A, provided that the same delay is induced by the delay elements 6201 to 6203, 6205 to 6207 and the delay elements 8201 to 8203, 8205 to 8207.

FIG. 7 shows a still further example of a skew sensor 7000. The skew sensor 7000 is similar to the skew sensor 6000. In particular, the not delayed first clock signal clk_A and the not delayed second clock signal clk_B are connected to the clock inputs of the skew detectors 7101 to 7103 and 7104 to 7107, respectively. However, the delay elements 7201 to 7203, 7205 to 7207 do not invert the delayed signal. Accordingly, the outputs of the skew detectors 7101 to 7103 have to be inverted and the outputs of the skew detectors 7104 to 7107 remain not inverted.

Figure 9:
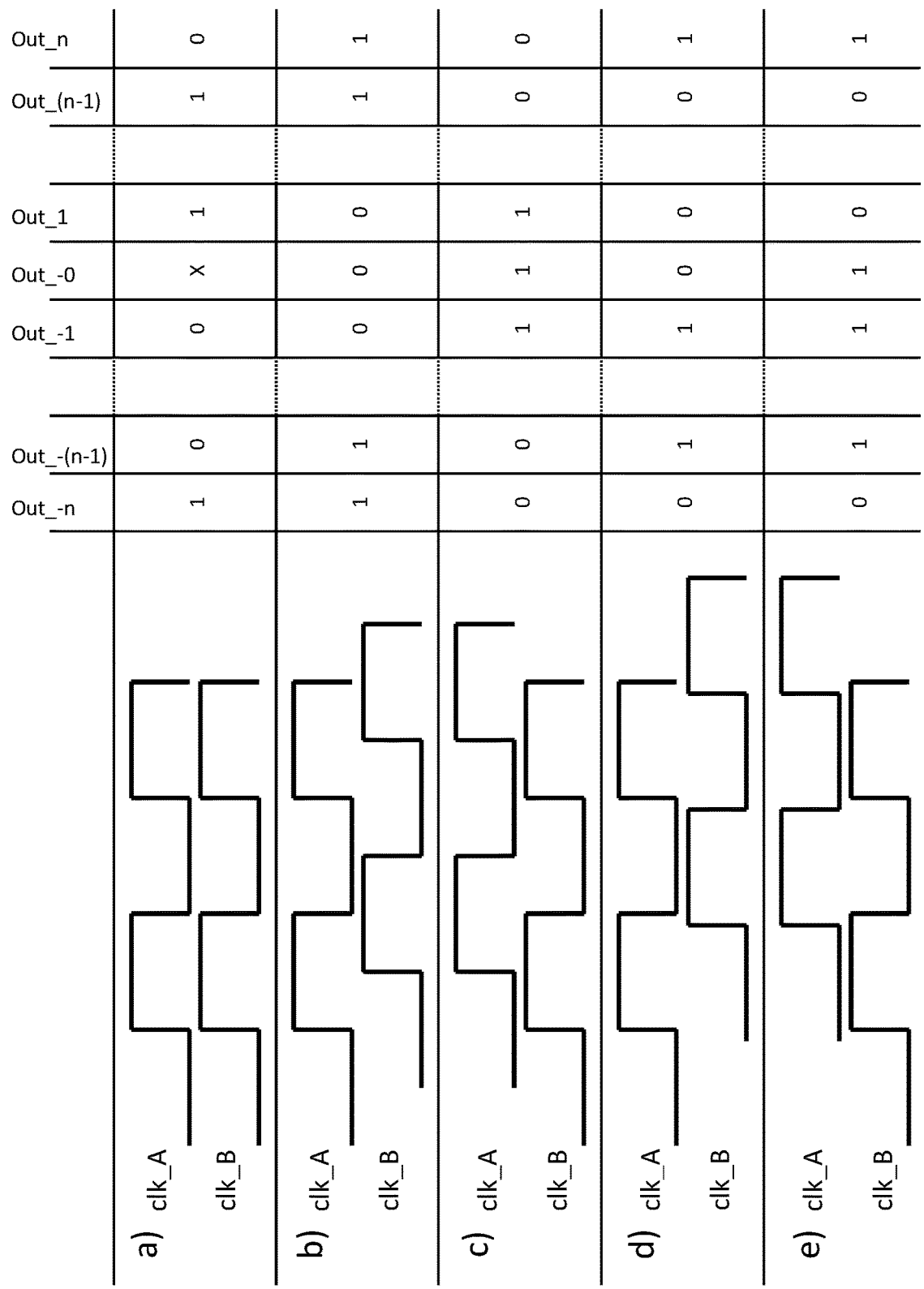
FIG. 9 illustrates outputs of the skew sensors of FIGS. 5 to 8.

FIG. 9 illustrates output signals of the skew sensors 5000, 6000, 7000 and 8000 for the depicted first clock signal clk_A and second clock signal clk_B having different skew values in situations a), b), c), d), e). It is assumed that the value of the delay difference, which is induced by different delay elements, between the two inputs of the skew detectors 5102, 6102, 7102, 8102, 5106, 6106, 7106, 8106 is less than half of the cycle time and that the value of the delay difference, which is induced by different delay elements, between the two inputs of the skew detectors 5101, 6101, 7101, 8101, 5107, 6107, 7107, 8107 is more than half of the cycle time.

In situation a), the skew between the first clock signal clk_A and the second clock signal clk_B is essentially zero. In situation b), the second clock signal clk_B is one fourth (¼) of the cycle time late with respect to the first clock signal clk_A. In situation c), the second clock signal clk_B is one fourth (¼) of the cycle time early with respect to the first clock signal clk_A. In situation d), the second clock signal clk_B is a little bit under one half (½) of the cycle time late with respect to the first clock signal clk_A. In situation e), the second clock signal clk_B is a little bit under one half (½) of the cycle time early with respect to the first clock signal clk_A.

The skew detectors 5101 to 5107, 6101 to 6107, 7101 to 7107 and 8101 to 8107 may only detect which input signal is late with respect to the other input signal. They may not be able to transmit an output signal indicating that the input signals arrive at exactly the same time. Thus, in the hypothetical situation a), the skew detectors 5104, 6104, 7104 and 8104 may transmit as output signal out_0 of the skew sensor 5000, 6000, 7000, 8000 either a "0" indicating that the second clock signal clk_B is late with respect to the first clock signal clk_A or a "1" indicating that the second clock signal clk_B is early with respect to the first clock signal clk_A. An "x" in the table indicates the undetermined value of the output signal out_0.

The skew detector 5103 receives the second clock signal clk_B with an additional delay induced by the delay element

5203. Accordingly, the skew detector 5103 will determine that the input signal associated with clk_B is now late with respect to the (not delayed) first clock signal clk_A. Hence, the skew detector 5103 will transmit a "0" as output signal out_1.

Vice versa, the skew detector 5105 receives the first clock signal clk_A with an additional delay induced by the delay element 5205. Thus, the skew detector 5105 will determine that the input signal associated with the (not delayed) second clock signal clk_B is now early with respect to the (delayed) first clock signal clk_A. Accordingly, the skew detector 5105 will transmit a "1" as output signal out_−1.

Correspondingly, the skew sensor 5000 transmit a "1" for all output signals up to and including the output signal out_−(n−1) and a "0" for all output signals up to and including the output signal out_(n−1).

The skew detector 5101 receives the second clock signal clk_B with an additional delay induced by the delay element 5201. The additional delay is larger than half of the cycle time of the second clock signal clk_B. Hence, the skew detector 5105 will no longer compare an edge of the second clock signal clk_B with an edge of the first clock signal clk_A of the same cycle, but with an edge of the first clock signal clk_A of the next cycle. Accordingly, the skew detector 5101 will determine that the input signal associated with the second clock signal clk_B is early with respect to the first clock signal clk_A and the skew detector 5101 will transmit a "1" as output signal out_n. Vice versa, the skew detector 5107 will transmit a "0" as output signal out_−n.

In situation b), the second clock signal clk_B is late with respect to the first clock signal clk_A. Accordingly, the skew detector 5104 transmits a "0" as output signal out_0. Further delaying the second clock signal clk_B by an amount less than one fourth (¼) of the clock cycle increases the skew between the second clock signal clk_B and the first clock signal clk_A. Hence, the skew detector 5103 will also transmit a "0" as output signal out_1. On the other hand, delaying the first clock signal clk_A by an amount less than one fourth (¼) of the cycle will not be sufficient to render the input signal associated with the second clock signal clk_B of the skew detector 5105 early with respect to the first clock signal clk_A. Thus, the skew detector 5105 will also transmit a "0" as output signal out_−1.

Further delaying the first clock signal clk_A will sooner or later render the first clock signal clk_A being late with respect to the second clock signal clk_B. Hence, the skew detector 5106 will transmit a "1" as output signal out_−(n−1). A still further delay will not make the skew detector 5107 comparing two edges of different clock cycles. Hence, the skew detector 5107 will also transmit a "1" as output signal out_−n.

However, further delaying the second clock signal clk_B will soon render the skew detectors comparing edges of different clock cycles. Thus, the skew detectors will no longer transmit an output signal indicating that the second clock signal clk_B is late, but an output signal indicating that the second clock signal clk_B is early. Accordingly, the skew detectors 5101 and 5102 will transmit a "1" as output signals out_(n−1) and out_n, respectively.

In situation c), the second clock signal clk_B is early with respect to the first clock signal clk_A. Thus, the skew detector 5104 transmits a "1" as output signal out_0. Delaying the first clock signal clk_A by an amount less than one fourth (¼) of the clock cycle increases the skew between the second clock signal clk_B and the first clock signal clk_A. Accordingly, the skew detector 5103 will also transmit a "1" as output signal out_1. Delaying the second clock signal clk_B by an amount less than one fourth (¼) of the cycle will not be sufficient to render the input signal associated with the second clock signal clk_B of the skew detector 5105 late with respect to the first clock signal clk_A. Hence, the skew detector 5105 will also transmit a "1" as output signal out_−1.

Further delaying the second clock signal clk_B will sooner or later render the first clock signal clk_A being early with respect to the second clock signal clk_B. Thus, the skew detector 5102 will transmit a "0" as output signal out_−(n−1). A still further delay will not make the skew detector 5101 comparing two edges of different clock cycles. Accordingly, the skew detector 5101 will also transmit a "0" as output signal out_−n.

On the other hand, further delaying the first clock signal clk_A will soon render the skew detectors comparing edges of different clock cycles. Thus, the skew detectors will no longer transmit an output signal indicating that the second clock signal clk_B is early, but an output signal indicating that the second clock signal clk_B is late. Accordingly, the skew detectors 5106 and 5107 will transmit a "0" as output signals out_(n−1) and out_n.

In situation d), the skew detector 5104 will determine that the second clock signal clk_B is late with respect to the first clock signal clk_A. Accordingly, the output signal out_0 will read "0". Further delaying the second clock signal clk_B will lead to a situation in which the skew detector 5103 will determine the skew between different cycles resulting in the output signal out_−1 reading "1". This continues until the delay induced is larger than half of the cycle time and the raising edge of the second clock signal clk_B arrives after the raising edge of the next cycle of the first clock signal clk_A. Accordingly, the output out_−n will read "0".

The skew detector 5105 will still transmit a "0" because the delay of the received signal associated with the first clock signal clk_A is not sufficient to render the received second clock signal clk_B early with respect to the received delayed first clock signal clk_A. Only when the induced delay amounts to more than half of the cycle time, the output changes and the output signal out_n will read "1".

In situation e), the skew detector 5104 will determine that the second clock signal clk_B is early with respect to the first clock signal clk_A. Thus, the output signal out_0 will read "1". The output signals will remain "1" until the second clock signal clk_B is delayed by more than half of the cycle time. Then, the output signal out_n will transmit a "0". On the other hand, delaying the first clock signal clk_A will render the skew detector 5105 comparing edges of different cycles. Thus, the skew detector will transmit a "0". This continues until a delay of more than half of the cycle time is introduced and the output out_n reads "1" again.

Although FIG. 9 has been explained essentially with reference to the skew sensor 5000, the same reasoning applies for the skew sensors 6000, 7000 and 8000.

A skew sensor measures a quantitative skew may allow for measuring a clock tree latency of a semiconductor circuit. Measuring a clock tree latency may be useful for the method for deskewing a second clock signal with respect to a first clock signal which has been explained with reference to FIG. 4.

Figure 10:
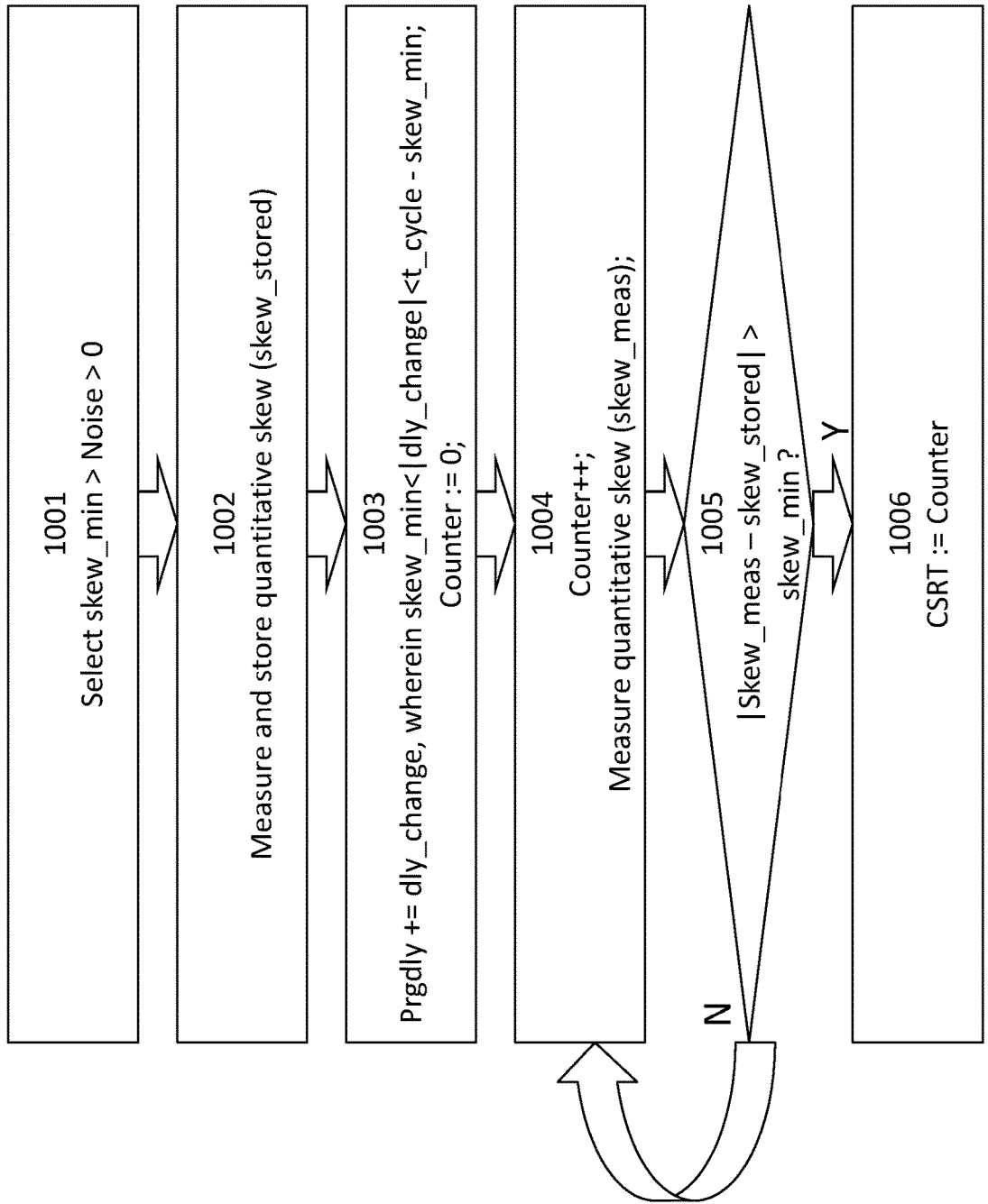
FIG. 10 illustrates a method for determining the clock tree response time of a logic device.

FIG. 10 illustrates in a simplified manner a method for measuring a clock tree latency of a semiconductor circuit comprising a clock source generating a clock signal, a programmable delay line, a clock tree and a quantitative skew sensor measure a skew between the delayed clock signal and the (original) clock signal which has been consecutively propagated through the programmable delay line and the clock tree.

In an idle state of the semiconductor circuit, the clock tree latency will only fluctuate by a limited amount due to noise. Thus, the quantitative (signed) skew between the delayed clock signal and the original clock signal measured by the quantitative skew sensor will also only fluctuate by a limited amount.

In step 1001, a minimal skew skew_min is selected greater than zero and sufficiently larger than the maximal expected fluctuation of the skew in an idle state of the semiconductor state.

The current quantitative skew between the delayed clock signal and the original clock signal is measured and stored (step 1002).

Afterwards, a delay induced by the programmable delay line is changed by an amount dly_change and a counter initialized (step 1003). The delay may be reduced or increased. Thus, the delay change dly_change may be a positive or negative value. The absolute value of the delay change dly_change is selected to be above the minimal skew skew_min and below the difference of the cycle time t_cycle and skew_min.

In the next clock cycle, the counter is increased and the current quantitative skew skew_meas is measured (step 1004).

The measured skew skew_meas is compared with the stored skew skew_stored (step 1005). If the absolute value of the difference between the measured skew skew_meas and the stored skew skew_stored is not larger than the minimal skew skew_min, the method repeats steps 1004 and 1005. If the absolute value of the difference between the measured skew skew_meas and the stored skew skew_stored is larger than the minimal skew skew_min, the number of cycles t_cycle as measured by the counter (step 1006) is determined to be the first control system response time (CSRT). A control system response time may indicate how much time it takes from changing a delay induced by the programmable delay line prgdly until the change is observable by the associated skew sensor. The control system response time may essentially correspond to measuring the clock tree latency of the associated clock tree.

In an embodiment of the aforementioned method, after determining the first control system response time, the currently measured skew skew_meas is stored as skew_stored, the delay induced by the programmable delay line prgdly is changed by an amount -dly_change and the counter is re-initialized. The currently measured skew skew_meas is compared with the stored skew skew_stored. If the absolute value of the difference between the measured skew skew_meas and the stored skew skew_stored is not larger than the minimal skew skew_min, the method repeats measuring the skew and comparing the measured skew skew_meas with the stored skew skew_stored. If the absolute value of the difference between the measured skew skew_meas and the stored skew skew_stored is larger than the minimal skew skew_min, the number of cycles t_cycle as measured by the counter is determined to be the second control system response time. Afterwards, the control system response time may be determined to be the maximum of the first control system response time and the second control system response time. Alternatively, the control system response time may be determined to be the average of the first control system response time and the second control system response time.

Another embodiment may include that changing the delay by an amount dly_change includes changing the delay induced by the programmable delay line by a dly_change to induce a change in the direction of the skew and comparing the measured skew skew_meas with the stored skew skew_stored includes detecting a change of the direction of the measured skew. Detecting a changing skew direction may reduce the number of bits to be compared every cycle.

During operation of a logic device, a second clock signal clk_B may have to be continuously deskewed with respect to a first clock signal clk_A, because voltage droops, cycle time changes, etc. may influence the first clock tree latency and/or the second clock tree latency.

If the second clock signal is to be deskewed with respect to the first clock signal and the second clock signal is late with respect to the first clock signal at a first point in time, a skew control system may reduce the delay induced by a programmable delay line associated with the second clock signal.

Due to the second clock tree latency, the skew detector will typically observe the change in the delay induced by the programmable delay line only after several clock cycles. Thus, during the next cycle the skew sensor will still measure a skew and will further reduce the delay induced by the programmable delay line. This may lead to a negative skew between the second clock signal and the first clock signal which has an even larger absolute value than the original (positive) skew between the second clock signal and the first clock signal.

Figure 11:
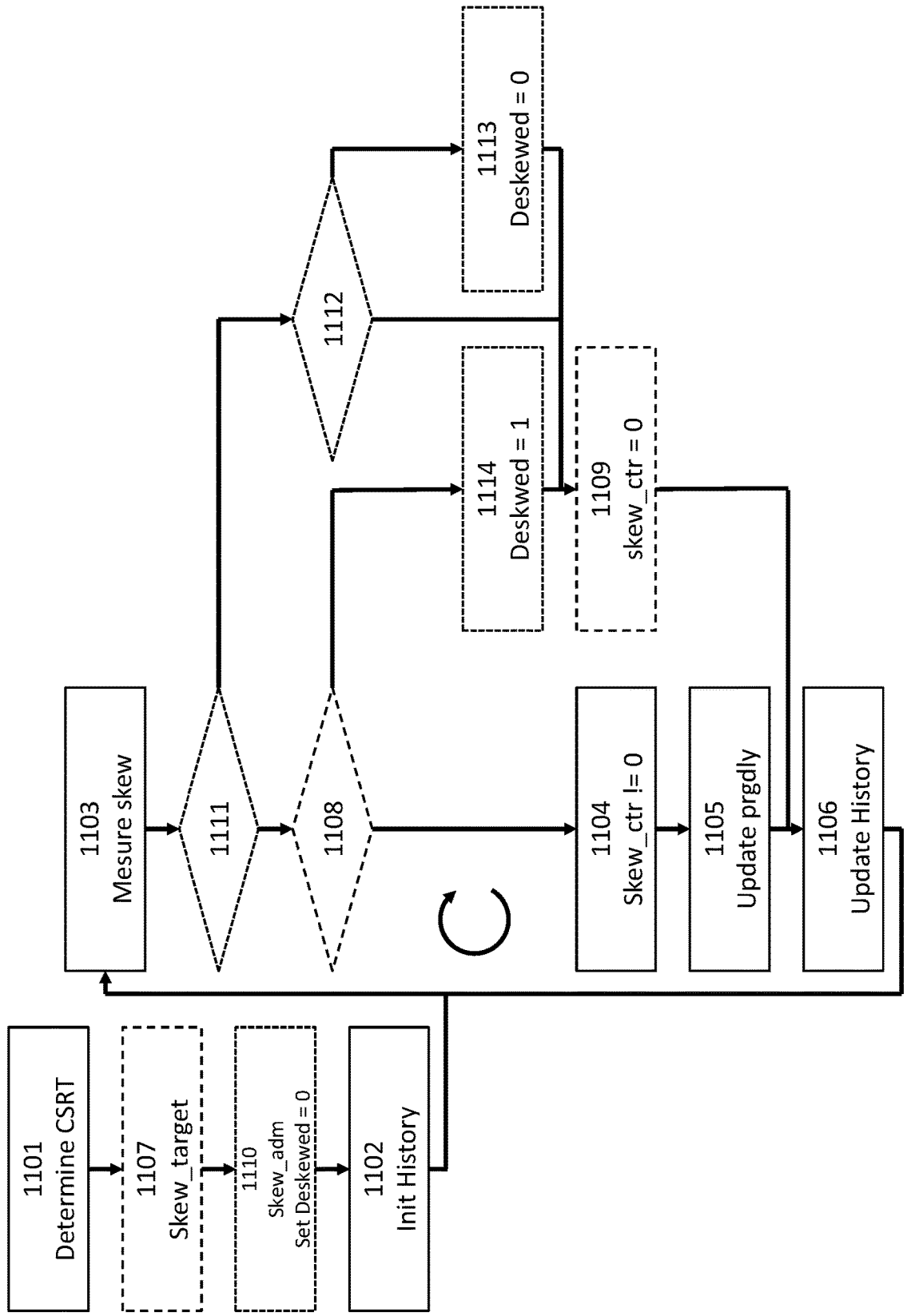
FIG. 11 illustrates a method for continuously deskewing the second clock signal with respect to the first clock signal.

FIG. 11 shows an example of an improved method for continuously adjusting a skew between a second clock signal clk_B and a first clock signal clk_A. Some steps of the method according to FIG. 11 may be optional and, accordingly, are described after the main steps.

The control system response time of the clock tree to be adjusted is determined. The control system response time may be determined using a simulation method or may be determined using the method described with respect to FIG. 10 (step 1101).

Further, an initialization of a history observing unit that maintains history data related to skew control commands takes place (step 1102).

The quantitative skew skew_meas between the second clock signal and the first clock signal is measured (step 1103).

Based on the history data, on a sum of delay changes initiated in a time window preceding the measurement, and the measured quantitative skew a skew control command is generated (step 1104). For example, if the measured quantitative skew skew_meas is larger than the inverse of the accumulated delay changes forwardAdj indicated by the history observing unit, the skew control command will correspond to a delay reduction. Otherwise the skew control command will correspond to a delay increase.

The delay of a programmable delay line in the clock tree is adjusted based on the skew control command (step 1105) and the history observing unit is updated with the current skew control command (step 1106). The steps 1103 to 1106 are repeated for every clock cycle for continuously adjusting the skew.

The history observing unit maintains history data related to skew control commands within a certain time window which may depend on the control system response time.

An optional step 1107 may set a target skew skew_target greater zero (skew_target>0). A skew with an absolute value below the target skew skew_target may correspond to a deskewed state of the second clock signal clk_B and the first clock signal clk_A.

Further, an optional step 1108 before step 1104 may check whether the absolute value of the difference of the measured quantitative skew skew_meas and the inverse of the accumulated delay changes forwardAdj is below the target skew skew_target (|skew_meas−(−forwardAdj)|<skew_target).

If this is the case, a skew control command does not change the delay induced by the programmable delay line (step 1109). Otherwise, the method continues with step 1104. Using a target skew skew_target may avoid that the delay induced by the programmable delay line is changed too frequently. This may help to avoid jitter and power consumption.

A further optional step 1110 may set an admissible skew skew_adm greater than the target skew skew_target. The admissible skew skew_adm may correspond to an absolute value to which the measured skew may rise after the first clock signal clk_A and the second clock signal clk_B have been deskewed before the two clock signals have to be deskewed again. Within step 1110 a deskewed flag that the first clock signal clk_A and the second clock signal clk_B are not deskewed (set deskewed:=0) may also be set.

After the measurement step 1103, an optional step 1111 may determine whether the deskewed flag indicates that the first clock signal clk_A and the second clock signal clk_B are deskewed or not (deskewed=0 ?). If the first clock signal clk_A and the second clock signal are not deskewed (deskewed=0), the method continues with step 1104 as has been described above. Otherwise, the method continues with step 1112.

The optional step 1112 may determine whether the absolute value of the difference between the measured skew skew_meas and the inverse of the accumulated delay changes forwardAdj is greater than the admissible skew skew_adm (|skew_meas−(−forwardAdj)|>skew_adm?).

If this is the case, the deskewed flag will be set to indicate that the first clock signal clk_A and the second clock signal clk_B are not deskewed (set deskewed:=0) in step 1113 and the skew control value is set to zero (step 1109). If not, the deskewed flag is set to one (1114), and the method directly sets the skew control value to zero.

The steps 1101, 1106, 1102 may be performed in a different order than shown in FIG. 11. For example, the method may start with step 1102 followed by step 1101 followed by step 1106.

Figure 13:
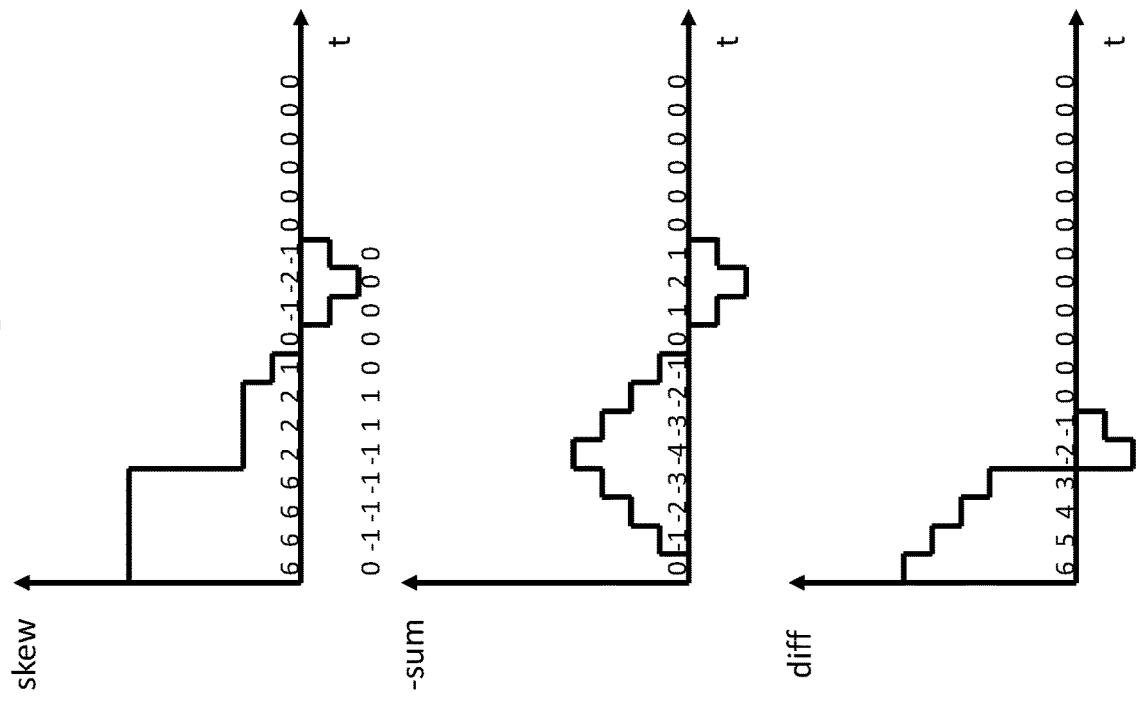
FIG. 13 is another illustration of the method of FIG. 11.
Figure 12:
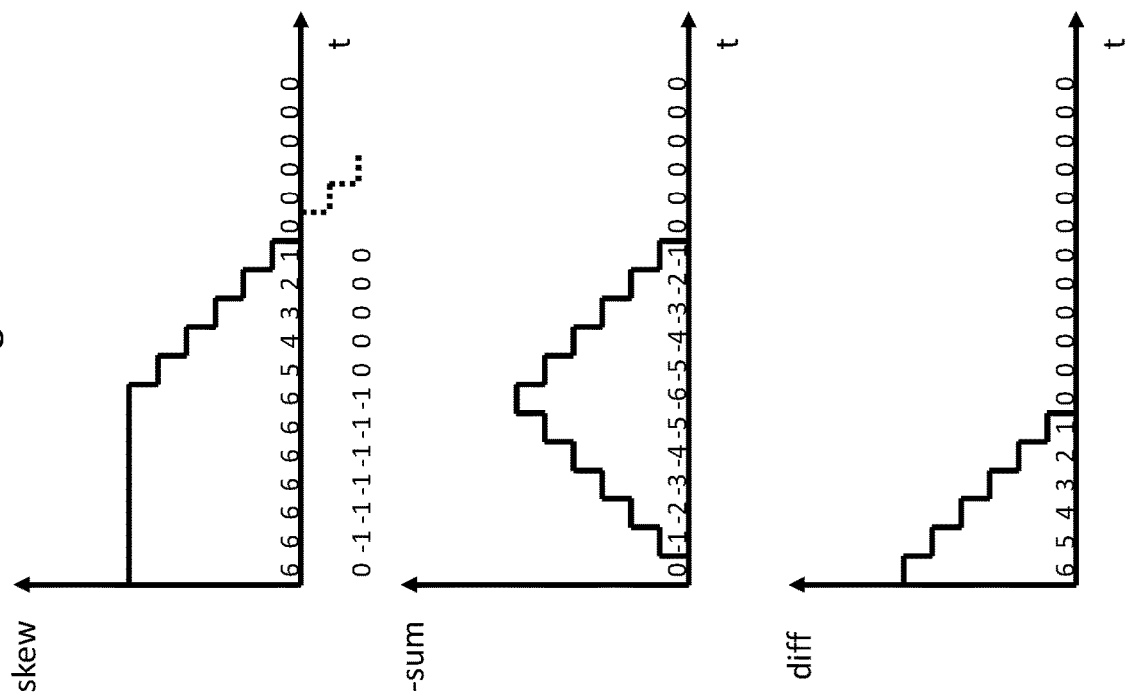
FIG. 12 illustrates the method of FIG. 11.

FIGS. 12 and 13 may provide a more detailed understanding of steps 1103, 1104, 1105 and 1106 of FIG. 11.

An instantaneous change of a programmable delay line prgdly during operation of a logic device may result in a very short (transient) cycle time (cycle compression) t_cycle. In particular, the cycle time t_cycle may become too short for ensuring proper calculation, propagation of data, etc. Thus, during operation of the semiconductor circuit, two different clocks should not be deskewed at once but the skew should be reduced by incrementing or decrementing the delay induced by the respective programmable delay line step by step. Accordingly, the following description is based on delay changes which are increments or decrements. However, during initialization of the logic device, also larger delay changes may be used to facilitate fast deskewing of the clock signals.

FIG. 12 depicts the skew measured by the skew sensor over several clock cycles. For simplification purposes, it is assumed that the skew is only influenced by changing the delay induced by the programmable delay line. Moreover, it is assumed that the delay has not been changed recently. At the beginning of the observed period the measured skew amounts to six units. The skew sensor measures the skew and the skew control unit compares the measured skew skew_meas with the skew control commands of the past. As the delay has not been changed recently, the skew control unit determines that the measured skew is greater than the inverse of the accumulated delay changes forwardAdj. More precisely, the difference between the measured skew and the inverse of the forwardAdjust is six units (cf. FIG. 12, lower diagram). Thus, the skew control unit controls the programmable delay line prgdly to reduce the delay induced by the programmable delay line prgdly by one unit. This is indicated with a "−1" for the next cycle below the x-axis of the diagram.

Moreover, the history observing unit stores the information that the skew control unit has controlled the programmable delay line prgdly to reduce the delay induced by the programmable delay line prgdly by one unit.

During the next cycle, the changed setting of the programmable delay line prgdly does not yet result in a changed skew. Due to the latency of the clock tree the reduction will only be observable at the skew sensor after a certain time, which is assumed to amount to six cycles in this example. Accordingly, the skew sensor will still measure a skew skew_meas of six units (cf. FIG. 12, upper diagram). The skew control unit will still determine that the measured skew skew_meas with six units is greater than the inverse of the accumulated delay changes forwardAdj with one unit. Hence, the skew control unit controls the programmable delay line prgdly to further reduce the delay induced by the programmable delay line prgdly by one unit and update the history observing unit accordingly, which will read "−2" in the next cycle.

During the next cycles the difference between the measured skew skew_meas and the accumulated delay changes forwardAdj will continuously decrease until it reaches zero and the skew control unit does not change the delay induced by the programmable delay line prgdly anymore even if the measured skew still amounts to six units. The measured skew skew_meas nevertheless decreases due to the former delay changes still propagating through the clock tree and finally reaches zero.

Would the skew control unit not account for delay changes still propagating through the clock tree but only take into account the currently measured skew, the skew would become negative as indicated with a dotted line.

FIG. 13 shows an example wherein the skew changes from the fourth to the fifth cycle, i.e. before any changed delay induced by the programmable delay line prgdly can be observed by the skew sensor. Such a skew change can be the result of a voltage droop, for example. As a result, the measured skew skew_meas becomes smaller than the inverse of the accumulated delay changes forwardAdj and the skew control unit controls the programmable delay line prgdly to increment the delay induced by the programmable delay line prgdly. Hence, the clock signals can be quickly deskewed again.

It is proposed a method for measuring a control system response time of a second clock tree, wherein the second clock signal has been propagated from a first clock source through a second clock tree, wherein the second clock tree comprises a programmable delay induces a delay, wherein the first clock signal has been propagated from the first clock source through a first clock tree, wherein the method comprises measuring a skew between the second clock signal and the first clock signal and storing the skew, initiating a delay change of a delay induced by the programmable delay line and starting a time measurement, at least one iteration of measuring the skew between the second clock signal and the first clock signal; comparing the measured skew with the stored skew; based on the result of the comparison, stopping after a current iteration and stopping the time measurement, and wherein a result of the time measurement is the control system response time.

In a further embodiment of the method, measuring the control system response time of the second clock tree comprises measuring a skew between the second clock signal and the first clock signal and storing the skew, initiating a delay change of a delay induced by the programmable delay line and starting a time measurement, at least one iteration of measuring the skew between the second clock signal and the first clock signal; comparing the measured skew with the stored skew; based on the result of the comparison, stopping after a current iteration and stopping the time measurement, and wherein a result of the time measurement is the control system response time.

In an embodiment of the method, an absolute value of the delay change is selected to be larger than a preselected minimum skew greater zero; comparing the measured skew with the stored skew comprises comparing the absolute value of the difference of the measured skew and the stored skew with the predetermined minimum skew; and stopping after the current iteration comprises stopping if the absolute value of the difference is larger than the predetermined minimum skew.

In another embodiment of the method, the delay change is selected to change the sign of the measured skew; comparing the measured skew with the stored skew comprises comparing the sign of the measured skew with the sign of the stored skew; and stopping is performed if the sign of the measured skew is different than the sign of the stored skew.

In a further embodiment of the method, measuring a skew between the first clock signal and the second clock signal comprises using a skew sensor for measuring a quantitative skew between a second clock signal and a first clock signal, the skew sensor comprises at least two skew detectors, each skew detector detects a skew between two input signals, a first skew detector receives either the first clock signal or the second clock signal as first input signal and the other one of the first clock signal and the second clock signal delayed by a first delay difference induced by one or more delay elements as second input signal, and a second skew detector receives either the first clock signal or the second clock signal as first input signal and the other one of the first clock signal and the second clock signal optionally delayed by a second delay difference induced by one more delay elements, wherein the second delay difference is different from the first delay difference, as second input signal.

In an embodiment of the method, at least one of the delay elements comprises an inverter.

In another embodiment of the method, at least one delay element is a programmable delay line.

In a further embodiment of the method, at least one skew detector comprises a D flip-flop.

In an embodiment of the method, the skew sensor comprises a first subset of skew detectors including the first skew detector and the second skew detector, the skew sensor comprises a first chain of delay elements, the first skew detector receives the other one of the first clock signal and the second clock signal delayed by the first delay difference as second input signal via a first node of the first chain of delay elements, and the second skew detector receives the other one of the first clock signal and the second clock signal delayed by the second delay difference as second input signal via a second node of the first chain of delay elements.

In another embodiment of the method, the delay elements are inverters, wherein an odd number of inverters are provided between the first node and the second node, and an inverter is provided between an output of either the first skew detector or the second skew detector and a corresponding output of the skew sensor.

In a further embodiment of the method, the skew sensor comprises a first chain of one or more delay elements and a separate second chain of one or more delay elements, the first skew detector and the second skew detector receive either the first clock signal or the second clock signal as first input, the second skew detector receives the first clock signal as first input, the first skew detector receives the other one of the first clock signal and the second clock delayed by the first chain of delay elements, and the second skew detector is receives the other one of the first clock signal and the second clock signal delay by the second chain of delay elements.

In an embodiment of the method, the first skew detector receives the first clock signal as first input signal, the first skew detector receives the second clock signal delayed by the first delay as second input signal, the second skew detector receives the second clock signal as first input signal, the second skew detector receives the first clock signal delay by the second delay as second input signal, and an inverter is provided between an output of either the first skew detector or the second skew detector and a corresponding output of the skew sensor.

In another embodiment of the method, the first skew detector receives the second clock signal as first input signal, the first skew detector receives the first clock signal delayed by the first delay as second input signal, the second skew detector receives the second clock signal as first input signal, and the second skew detector receives the first clock signal delay by the second delay as second input signal.

Moreover, it is proposed a logic device for measuring a control system response time of a second clock tree, wherein the second clock signal has been propagated from a first clock source through a second clock tree, wherein the second clock tree comprises a programmable delay line induces a delay, wherein the first clock signal has been propagated from the first clock source through a first clock tree, wherein the logic device comprises a counter that clocked by one of the first clock signal and the second clock signal, wherein the skew control unit measures a control system response time of the second clock tree and determining the second clock tree latency based on the control system response time, wherein measuring the control system response time of the second clock tree comprises measuring a skew between the second clock signal and the first clock signal and storing the skew, initiating a delay change of a delay induced by the programmable delay line and starting a time measurement, at least one iteration of measuring the skew between the second clock signal and the first clock signal; comparing the measured skew with the stored skew; based on the result of the comparison, stopping after a current iteration and stopping the time measurement, and wherein a result of the time measurement is the control system response time, wherein starting a time measurement comprises initializing and starting a counter, and wherein stopping a time measurement comprises stopping the counter.

In an embodiment of the logic device, an absolute value of the delay change is selected to be larger than a preselected minimum skew greater zero, comparing the measured skew with the stored skew comprises comparing the absolute value of the difference of the measured skew and the stored skew with the predetermined minimum skew, and stopping after the current iteration comprises stopping if the absolute value of the difference is larger than the predetermined minimum skew.

In an embodiment of the logic device, the delay change is selected to change the sign of the measured skew, comparing the measured skew with the stored skew comprises comparing the sign of the measured skew with the sign of the stored skew, and stopping is performed if the sign of the measured skew is different than the sign of the stored skew.

In a further embodiment of the logic device, the logic device further comprises a skew sensor comprises at least two skew detectors, wherein each skew detector detects a skew between two input signals, wherein a first skew detector receives either the first clock signal or the second clock signal as first input signal and the other one of the first clock signal and the second clock signal delayed by a first delay difference induced by one or more delay elements as second input signal, wherein a second skew detector receives either the first clock signal or the second clock signal as first input signal and the other one of the first clock signal and the second clock signal optionally delayed by a second delay difference induced by one more delay elements, wherein the second delay difference is different from the first delay difference, as second input signal, and wherein the skew control unit measures a skew between the first clock signal and the second clock signal comprises using the skew sensor.

In an embodiment of the logic device, at least one of the delay elements comprises an inverter.

In another embodiment of the logic device, at least one delay element is a programmable delay line.

In a further embodiment of the logic device, at least one skew detector comprises a D flip-flop.

In an embodiment of the logic device, the skew sensor comprises a first subset of skew detectors including the first skew detector and the second skew detector, wherein the skew sensor comprises a first chain of delay elements, wherein the first skew detector receives the other one of the first clock signal and the second clock signal delayed by the first delay difference as second input signal via a first node of the first chain of delay elements, and wherein the second skew detector receives the other one of the first clock signal and the second clock signal delayed by the second delay difference as second input signal via a second node of the first chain of delay elements.

In another embodiment of the logic device, the delay elements are inverters, an odd number of inverters is provided between the first node and the second node, and an inverter is provided between an output of either the first skew detector or the second skew detector and a corresponding output of the skew sensor.

In a further embodiment of the logic device, the skew sensor comprises a first chain of one or more delay elements and a separate second chain of one or more delay elements, the first skew detector and the second skew detector either the first clock signal or the second clock signal as first input, the second skew detector receives the first clock signal as first input, the first skew detector receives the other one of the first clock signal and the second clock signal delayed by the first chain of delay elements, and the second skew detector receives the other one of the first clock signal and the second clock signal delay by the second chain of delay elements.

In an embodiment of the logic device, the first skew detector receives the first clock signal as first input signal, the first skew detector receives the second clock signal delayed by the first delay as second input signal, the second skew detector receives the second clock signal as first input signal, the second skew detector receives the first clock signal delay by the second delay as second input signal, and an inverter is provided between an output of either the first skew detector or the second skew detector and a corresponding output of the skew sensor.

In another embodiment of the logic device, the first skew detector receives the second clock signal as first input signal, the first skew detector receives the first clock signal delayed by the first delay as second input signal, the second skew detector receives the second clock signal as first input signal, and the second skew detector receives the first clock signal delay by the second delay as second input signal.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for measuring a control system response time of a second clock tree,
   wherein the second clock signal has been propagated from a first clock source through a second clock tree,
   wherein the second clock tree comprises a programmable delay line that induces a delay, wherein the first clock signal has been propagated from the first clock source through a first clock tree,
   wherein the method comprises
   measuring a skew between the second clock signal and the first clock signal and storing the skew,
   initiating a delay change of a delay induced by the programmable delay line and starting a time measurement,
   at least one iteration of
     measuring the skew between the second clock signal and the first clock signal;
     comparing the measured skew with the stored skew;
     based on the result of the comparison, stopping after a current iteration and stopping the time measurement, and
   wherein a result of the time measurement is the control system response time.

2. The method according to claim 1,
   wherein an absolute value of the delay change is selected to be larger than a preselected minimum skew greater zero;
   wherein comparing the measured skew with the stored skew comprises
   comparing the absolute value of the difference of the measured skew and the stored skew with the predetermined minimum skew;
   wherein stopping after the current iteration comprises stopping if the absolute value of the difference is larger than the predetermined minimum skew.

3. The method according to claim 1,
   wherein the delay change is selected to change the sign of the measured skew;

wherein comparing the measured skew with the stored skew comprises comparing the sign of the measured skew with the sign of the stored skew;
wherein stopping is performed if the sign of the measured skew is different than the sign of the stored skew.

4. The method according to claim 1,
wherein measuring a skew between the first clock signal and the second clock signal comprises using a skew sensor for measuring a quantitative skew between a second clock signal and a first clock signal,
wherein the skew sensor comprises at least two skew detectors,
wherein each skew detector detects a skew between two input signals,
wherein a first skew detector receives either the first clock signal or the second clock signal as first input signal and the other one of the first clock signal and the second clock signal delayed by a first delay difference induced by one or more delay elements as second input signal,
wherein a second skew detector receives either the first clock signal or the second clock signal as first input signal and the other one of the first clock signal and the second clock signal optionally delayed by a second delay difference induced by one more delay elements, wherein the second delay difference is different from the first delay difference, as second input signal.

5. The method according to claim 4, wherein at least one of the delay elements comprises an inverter.

6. The method according to claim 4, wherein at least one delay element is a programmable delay line.

7. The method according to claim 4, wherein at least one skew detector comprises a D flip-flop.

8. The method according to claim 4, wherein the skew sensor comprises a first subset of skew detectors including the first skew detector and the second skew detector, the skew sensor comprises a first chain of delay elements, the first skew detector receives the other one of the first clock signal and the second clock signal delayed by the first delay difference as second input signal via a first node of the first chain of delay elements, and the second skew detector receives the other one of the first clock signal and the second clock signal delayed by the second delay difference as second input signal via a second node of the first chain of delay elements.

9. The method according to claim 4, wherein the delay elements are inverters, wherein an odd number of inverters are provided between the first node and the second node, and an inverter is provided between an output of either the first skew detector or the second skew detector and a corresponding output of the skew sensor.

10. The method according to claim 4, wherein the skew sensor comprises a first chain of one or more delay elements and a separate second chain of one or more delay elements, the first skew detector and the second skew detector receive either the first clock signal or the second clock signal as first input, the second skew detector receives the first clock signal as first input, the first skew detector receives the other one of the first clock signal and the second clock delayed by the first chain of delay elements, and the second skew detector receives the other one of the first clock signal and the second clock signal delay by the second chain of delay elements.

11. A logic device for measuring a control system response time of a second clock tree,
wherein the second clock signal has been propagated from a first clock source through a second clock tree,
wherein the second clock tree comprises a programmable delay line that induces a delay,
wherein the first clock signal has been propagate from the first clock source through a first clock tree,
wherein the logic device comprises a counter that is clocked by one of the first clock signal and the second clock signal,
wherein the skew control unit measures a control system response time of the second clock tree and determining the second clock tree latency based on the control system response time,
wherein measuring the control system response time of the second clock tree comprises
measuring a skew between the second clock signal and the first clock signal and storing the skew,
initiating a delay change of a delay induced by the programmable delay line and starting a time measurement,
at least one iteration of
measuring the skew between the second clock signal and the first clock signal;
comparing the measured skew with the stored skew;
based on the result of the comparison, stopping after a current iteration and stopping the time measurement, and
wherein a result of the time measurement is the control system response time,
wherein starting a time measurement comprises initializing and starting the counter, and
wherein stopping a time measurement comprises stopping the counter.

12. The logic device according to claim 11,
wherein an absolute value of the delay change is selected to be larger than a preselected minimum skew greater zero;
wherein comparing the measured skew with the stored skew comprises
comparing the absolute value of the difference of the measured skew and the stored skew with the predetermined minimum skew;
wherein stopping after the current iteration comprises stopping if the absolute value of the difference is larger than the predetermined minimum skew.

13. The logic device according to claim 11,
wherein the delay change is selected to change the sign of the measured skew;
wherein comparing the measured skew with the stored skew comprises comparing the sign of the measured skew with the sign of the stored skew;
wherein stopping is performed if the sign of the measured skew is different than the sign of the stored skew.

14. The logic device according to claim 11,
wherein the logic device further comprises
a skew sensor comprising at least two skew detectors,
wherein each skew detector detects a skew between two input signals,
wherein a first skew detector receives either the first clock signal or the second clock signal as first input signal and the other one of the first clock signal and the second clock signal delayed by a first delay difference induced by one or more delay elements as second input signal,
wherein a second skew detector receives either the first clock signal or the second clock signal as first input signal and the other one of the first clock signal and the second clock signal optionally delayed by a second delay difference induced by one more delay elements, wherein the second delay difference is different from the first delay difference, as second input signal, and wherein the skew control unit measures a skew between the first clock signal and the second clock signal comprises using the skew sensor.

15. The logic device according to claim 11, wherein at least one of the delay elements comprises an inverter.

16. The logic device according to claim 11, wherein at least one delay element is a programmable delay line.

17. The logic device according to claim 11, wherein at least one skew detector comprises a D flip-flop.

18. The logic device according to claim 11, wherein the skew sensor comprises a first subset of skew detectors including the first skew detector and the second skew detector, wherein the skew sensor comprises a first chain of delay elements, wherein the first skew detector receives the other one of the first clock signal and the second clock signal delayed by the first delay difference as second input signal via a first node of the first chain of delay elements, and wherein the second skew detector receives the other one of the first clock signal and the second clock signal delayed by the second delay difference as second input signal via a second node of the first chain of delay elements.

19. The logic device according to claim 11, wherein the delay elements are inverters, an odd number of inverters is provided between the first node and the second node, and an inverter is provided between an output of either the first skew detector or the second skew detector and a corresponding output of the skew sensor.

20. The logic device according to claim 11, wherein the skew sensor comprises a first chain of one or more delay elements and a separate second chain of one or more delay elements, the first skew detector and the second skew detector receive either the first clock signal or the second clock signal as first input, the second skew detector receives the first clock signal as first input, the first skew detector receives the other one of the first clock signal and the second clock delayed by the first chain of delay elements, and the second skew detector receives the other one of the first clock signal and the second clock signal delayed by the second chain of delay elements.

* * * * *